(12) United States Patent
Ellis-Monaghan et al.

(10) Patent No.: US 7,915,056 B2
(45) Date of Patent: Mar. 29, 2011

(54) IMAGE SENSOR MONITOR STRUCTURE IN SCRIBE AREA

(75) Inventors: John J. Ellis-Monaghan, Grand Isle, VT (US); Mark D. Jaffe, Shelburne, VT (US); Sambasivan Narayan, Essex Junction, VT (US); Anthony J. Perri, Jericho, VT (US); Richard J. Rassel, Colchester, VT (US); Tian Xia, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 287 days.

(21) Appl. No.: 12/051,868

(22) Filed: Mar. 20, 2008

(65) Prior Publication Data

US 2009/0237103 A1    Sep. 24, 2009

(51) Int. Cl.
*G01R 31/26* (2006.01)

(52) U.S. Cl. .......... 438/14; 438/15; 438/17; 438/18; 257/48; 257/E21.521; 257/E23.179; 257/E21.524

(58) Field of Classification Search ............. 324/765; 250/208.1; 257/48, E21.521, E23.179, E21.524; 438/14, 15, 17, 18

See application file for complete search history.

(56) References Cited

U.S. PATENT DOCUMENTS

| | | | |
|---|---|---|---|
| 6,346,432 B2 | 2/2002 | Sugimura | |
| 6,489,798 B1 * | 12/2002 | Scott-Thomas et al. | 324/765 |
| 7,215,133 B2 | 5/2007 | Kwark | |
| 2003/0034489 A1 | 2/2003 | Bhattacharya et al. | |
| 2005/0156165 A1 * | 7/2005 | Eldridge et al. | 257/48 |
| 2006/0157702 A1 | 7/2006 | Sukman-Prahofer et al. | |
| 2007/0151948 A1 * | 7/2007 | Kool et al. | 216/83 |
| 2007/0246639 A1 * | 10/2007 | Yu | 250/208.1 |

* cited by examiner

*Primary Examiner* — Ngan Ngo
*Assistant Examiner* — Benjamin Tsu-Hung Liu
(74) *Attorney, Agent, or Firm* — Scully, Scott, Murphy & Presser, P.C.; Anthony Canale

(57) ABSTRACT

A semiconductor die including a semiconductor chip and a test structure, located in a scribe area, is designed and manufactured. The test structure includes an array of complementary metal oxide semiconductor (CMOS) image sensors that are of the same type as CMOS image sensors employed in another array in the semiconductor chip and having a larger array size. Such a test structure is provided in a design phase by providing a design structure in which the orientations of the CMOS image sensors match between the two arrays. The test structure provides effective and accurate monitoring of manufacturing processes through in-line testing before a final test on the semiconductor chip.

10 Claims, 7 Drawing Sheets

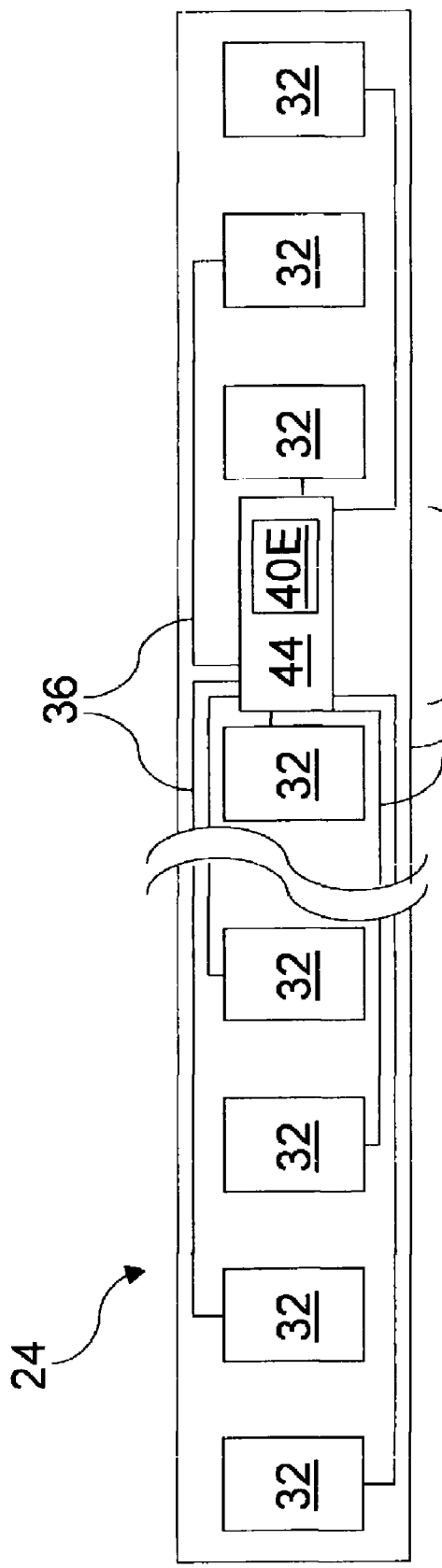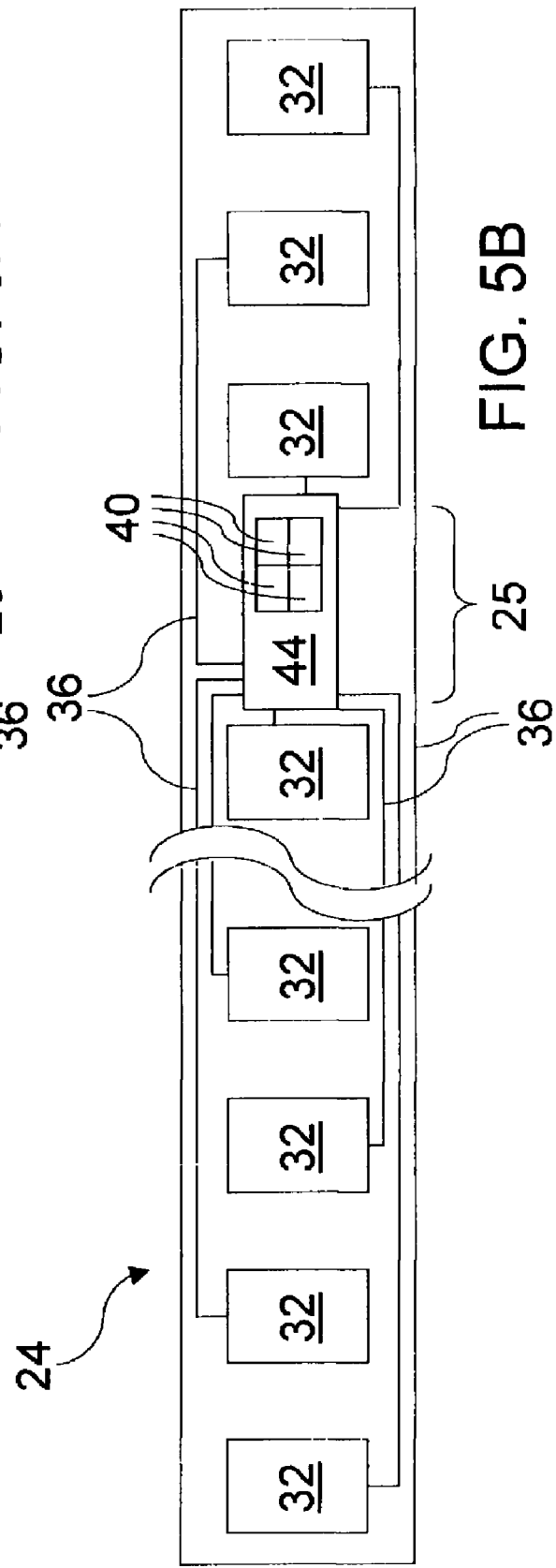

IMAGE SENSOR MONITOR STRUCTURE IN SCRIBE AREA

FIELD OF THE INVENTION

The present invention relates to semiconductor circuits and semiconductor circuit design, and more particularly to an image sensor monitor structure in a semiconductor substrate, methods of manufacturing the same, a design structure for the same.

BACKGROUND OF THE INVENTION

An image sensor converts a visual image to digital data that may be represented by a picture. The image sensor comprises an array of pixels, which are unit devices for the conversion of the visual image into the digital data. Digital cameras and optical imaging devices employ an image sensor. Image sensors include charge-coupled devices (CCDs) or complementary metal oxide semiconductor (CMOS) image sensors.

While CMOS image sensors have been more recently developed compared to the CCDs, CMOS image sensors provide an advantage of lower power consumption, smaller size, and faster data processing than CCDs as well as direct digital output that is not available in CCDs. Also, CMOS image sensors have lower manufacturing cost compared with the CCDs since many standard semiconductor manufacturing processes may be employed to manufacture CMOS image sensors. For these reasons, commercial employment of CMOS image sensors has been steadily increasing in recent years.

Since each image sensor pixel needs to be located at a unique position within the array, replacement of a non-functional image sensor pixel is difficult. Thus, it is imperative to achieve a defect-free array for a commercially viable manufacture of CMOS image sensors.

Typically, monitoring of semiconductor manufacturing processes is facilitated by small test structure in a scribe area, or a "KERF" area, which is a small area outside the area of a product chip. The test structure is tested early on during the manufacturing sequence prior to a final test so that any process deviations in the manufacturing processes may be detected early on, and to provide a fast feedback mechanism to the manufacturing processes without waiting for the results from the final test.

While placement of an image sensor structure in the test structure provides some early feedback on the manufacturing processes, the information derived from such an image sensor is likely to be inadequate because defect generation may be a statistical process and the image sensor structure in the test structure may not adequately reproduce defects that may be present in an image sensor array in a product chip. In other words, discrete image sensor structures may not be able to provide enough sampling of the defects when the nature of defects is statistical. Parameters of one image sensor or several image sensors do not reliably predict the statistical operation of an array of image sensors containing on the order of 1 million image sensor pixels. Further, external drive/readback circuits have significant influence on device performance, for example, by a non-negligible level of leakage current. In addition, image sensors are analog devices that do not lend themselves amenable to built-in-self-test (BIST) or other standard test access methods. Despite the above mentioned difficulties in testing, however, detection of such process defects in a timely manner is critical in an economically viable manufacturing of a semiconductor chip containing a CMOS image sensor array.

In view of the above, there exists a need for a method of monitoring process defects that are statistical in nature. Further, there exists a need for a design structure for providing sufficiently sensitive monitoring of process defects that may be detected only statistically. Yet further, there exists a need for a structure for providing such sensitive monitoring of process defects.

In addition, different types of image sensor pixels may be employed among different semiconductor chips. Thus, there exists a need to provide a test structure incorporating the same type of image sensor as the image sensors employed in a semiconductor chip on the same semiconductor substrate, a method of generating a design structure for the same, and a method of monitoring process defects employing the same.

SUMMARY OF THE INVENTION

To address the needs described above, the present invention provides a test structure containing a small array of image sensors that replicate the functionality of a CMOS image sensor array in a product chip, a method of generating the same, and a design structure for the same.

In the present invention, a semiconductor die including a semiconductor chip and a test structure, located in a scribe area, is designed and manufactured. The test structure includes an array of complementary metal oxide semiconductor (CMOS) image sensors that are of the same type as CMOS image sensors employed in another array in the semiconductor chip and having a larger array size. Such a test structure is provided in a design phase by providing a design structure in which the orientations of the CMOS image sensors match between the two arrays. The test structure provides effective and accurate monitoring of manufacturing processes through in-line testing before a final test on the semiconductor chip.

According to an aspect of the present invention, a method of monitoring process defects of a complementary metal oxide semiconductor (CMOS) image sensor array is provided, which comprises:

manufacturing a semiconductor die containing at least one semiconductor chip and at least one test structure, wherein each of the at least one semiconductor chip includes a first array of complementary metal oxide semiconductor (CMOS) image sensors of a type, and wherein each of the at least one test structure includes a second array of complementary metal oxide semiconductor (CMOS) image sensors of the type; and testing the at least one test structure to provide feedback on semiconductor manufacturing processes employed to manufacture the at least one semiconductor chip.

In one embodiment, the method further comprises designing the at least one test structure such that the CMOS image sensors in the first array and the CMOS image sensors in the second array have the same orientation.

In another embodiment, the method further comprises:

designing the at least one test structure with an empty reserved area for the second array prior to completion of design of the at least one test structure; and filling the empty reserved area in a design data with the CMOS image sensors prior to manufacture of the semiconductor die.

In even another embodiment, the method further comprises adjusting orientation of the CMOS image sensors of the second array to match an orientation of the CMOS image sensors of the first array.

In yet another embodiment, the first array has a greater number of the CMOS image sensors than the second array. The second array may be an m×n array, wherein m is a number greater than or equal to 2 and less than or equal to 1024, and wherein n is a number greater than or equal to 2 and less than or equal to 1024. Typically, m is a number greater than or equal to 8 and less than or equal to 24, and n is a number greater than or equal to 8 and less than or equal to 24.

In still another embodiment, each of the at least one the test structure further comprises:

a set of pads; and electrical wiring connecting the set of pads and the second array such that the second array is testable through the set of pads.

In a further embodiment, each of the at least one test structure further comprises a peripheral circuitry configured to be connected with a plurality of types of CMOS image sensors.

In an even further embodiment, the peripheral circuitry comprises a row decoder, a column decoder, a row driver, column receivers, a column multiplexer, and an operational amplifier (OP-amp).

According to another aspect of the present invention, a design structure embodied in a machine readable medium for designing, manufacturing, or testing a design is provided. The design structure comprises:

a first data representing a semiconductor chip, wherein the first data includes a second data representing a first array of complementary metal oxide semiconductor (CMOS) image sensors of a same type; and a third data representing a test structure, wherein the third data includes a fourth data representing a set of pads, a fifth data representing a second array of complementary metal oxide semiconductor (CMOS) image sensors of the same type, and a sixth data representing electrical wiring connecting the set of pads and the second array such that the second array is testable through the set of pads.

In one embodiment, the design structure comprises a netlist.

In another embodiment, the design structure resides on storage medium as a data format used for exchange of layout data of integrated circuits.

In even another embodiment, the second data and the fifth data are configured such that the CMOS image sensors in the first array and the CMOS image sensors in the second array have a same orientation.

In yet another embodiment, the first array has a greater number of the CMOS image sensors than the second array.

According to yet another aspect of the present invention, a semiconductor structure located within a semiconductor die is provided. The semiconductor structure comprises:

a semiconductor chip including a first array of complementary metal oxide semiconductor (CMOS) image sensors of a type; and a test structure including a set of pads, a second array of complementary metal oxide semiconductor (CMOS) image sensors of the type, and electrical wiring connecting the set of pads and the second array such that the second array is testable through the set of pads.

In one embodiment, the CMOS image sensors in the first array and the CMOS image sensors in the second array have a same orientation.

In another embodiment, the first array has a greater number of the CMOS image sensors than the second array. The second array may be an m×n array, wherein m is a number greater than or equal to 2 and less than or equal to 1024, and wherein n is a number greater than or equal to 2 and less than or equal to 1024. Typically, m is a number greater than or equal to 8 and less than or equal to 24, and n is a number greater than or equal to 8 and less than or equal to 24.

BRIEF DESCRIPTION OF THE DRAWINGS

FIGS. 5A and 5B show the design process employed to design an exemplary test structure according to the present invention.

DETAILED DESCRIPTION OF THE INVENTION

As stated above, the present invention relates to an image sensor monitor structure in a semiconductor substrate, methods of manufacturing the same, a design structure for the same, which are now described in detail with accompanying figures. It is noted that like and corresponding elements are referred to by like names and/or labels across the various embodiment of the present invention.

Figure 1:
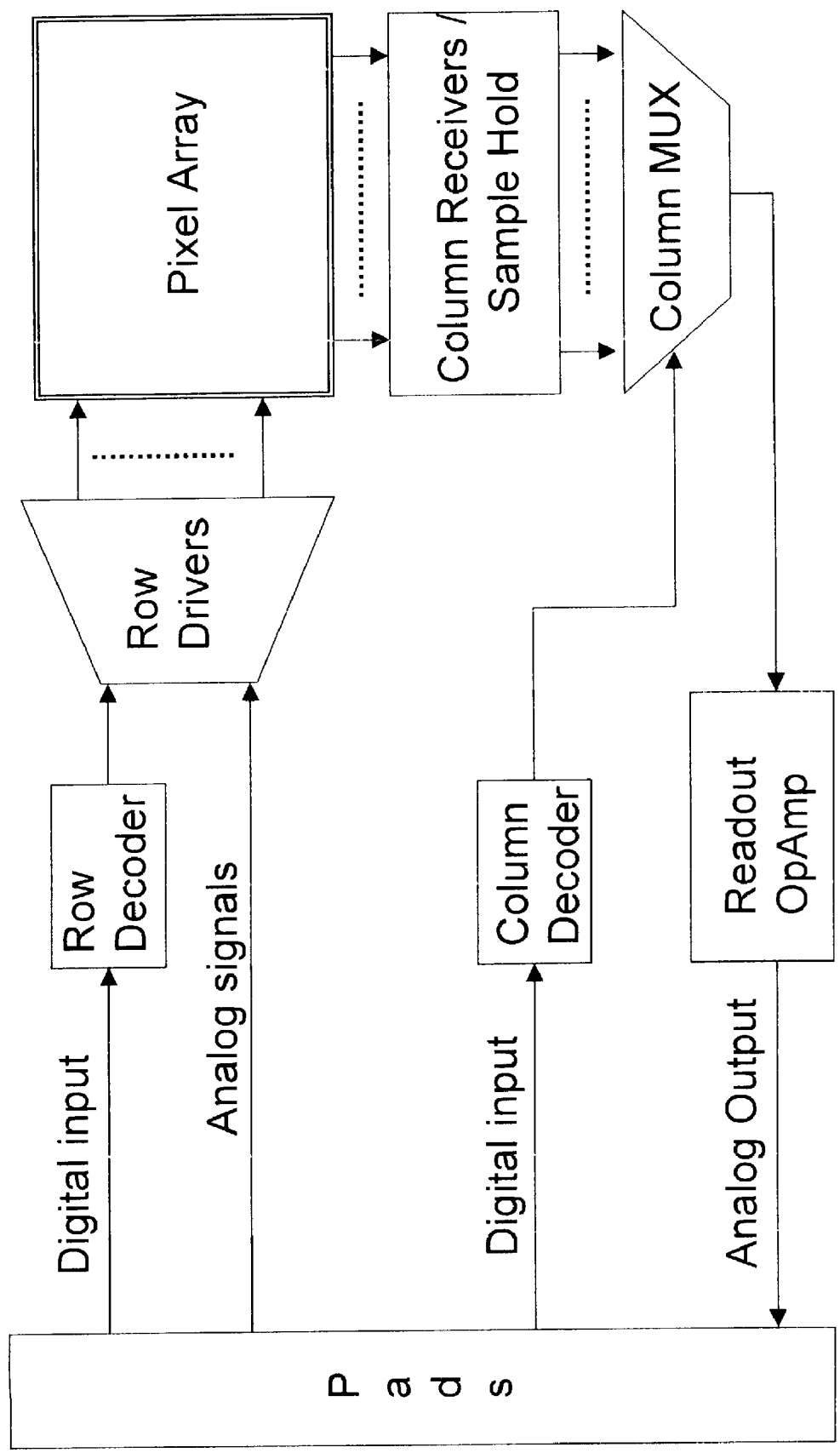
FIG. 1 is a schematic diagram illustrating operation of an exemplary test structure during testing according to the present invention.

Referring to FIG. 1, a schematic diagram showing components and data paths of an exemplary test structure according to the present invention is shown. The exemplary test structure comprises pads, a pixel array, and a peripheral circuitry comprises a row decoder, a column decoder, a row driver, column receivers, a column multiplexer, and an operational amplifier (OP-amp). The exemplary test structure is formed within a semiconductor die that is formed on a semiconductor substrate. In this case, the semiconductor die comprises the exemplary test structure and a semiconductor chip.

The pads are separate conductive structures formed in the exemplary test structure on a semiconductor substrate. The number of pads range from about 10 to about 100, and typically from about 15 to about 50. The pads typically comprise a metallic material such as Cu or Al. The pads may be located in a linear array such as a 1×j array or a rectangular array such as k×l array, wherein j is from about 10 to about 100, k is from about 2 to 10, and l is from about 5 to 50. The pads may have a polygonal shape, and typically a rectangular shape. The pitch of the pads, or the distance between adjacent pads may be from about 30 μm to about 500 μm, and typically from about 50 μm to about 200 μm. In case the pads have a rectangular shape, the pads may have a length from about 50 μm to about 200 μm, and a width from about 30 μm to about 100 μm. Most common sized rectangular pads include 60 μm×90 μm pads and 60 μm×60 μm pads.

The pixel array, or the "array" comprises a plurality of complementary metal oxide semiconductor (CMOS) image sensors, or CMOS image sensor pixels. The image sensors are of the same type and match the type of image sensors employed in a product array of CMOS image sensors (not shown) located in a semiconductor chip. The pixel array may be an m×n array of the image sensors, in which m is a number greater than or equal to 2 and less than or equal to 1024 and n is a number greater than or equal to 2 and less than or equal to 1024. Typically, m is a number greater than or equal to 8 and less than or equal to 24, and n is a number greater than or equal to 8 and less than or equal to 24. The total number of CMOS image sensors in the pixel array may be from about 4 to about 1 million, and typically from about 64 to about 576.

The peripheral circuitry supports logic and analog operation on the pixel array so that digital and analog signals may flow between the pads and the pixel array through electrical wiring (not shown). The electrical wiring provides electrical connection between the pads and the peripheral circuitry.

The row decoder selects a row based on an address input provided through a first subset of the pads. The address inputs are typically digital inputs. Analog signals may also be provided as an input signal. The address of the row as decoded by the row decoder and the analog signals are provided to the row drivers to test the image sensor pixels in the selected row of the pixel array. The output of the pixel array, which is the test result from the selected row, is provided to a column receiver, which may include devices to enable "sample hold," or a buffer that enables temporary holding of the output data. Typically, column multiplexer (column MUX) is employed to enable a serial output of the output data that is held in the column receiver. Another digital input containing a column address is provided to a column decoder, which decodes the digital input and provides the selected column address to the column multiplexer. The output data, which is in the form of an analog signal and generated by the response of an image sensor corresponding to the selected row address and the selected column address, is transmitted to a readout OP amplifier (OP-amp), which amplifies the output data and provides an analog output to an output pad, which is one of the pads.

Figure 2A:
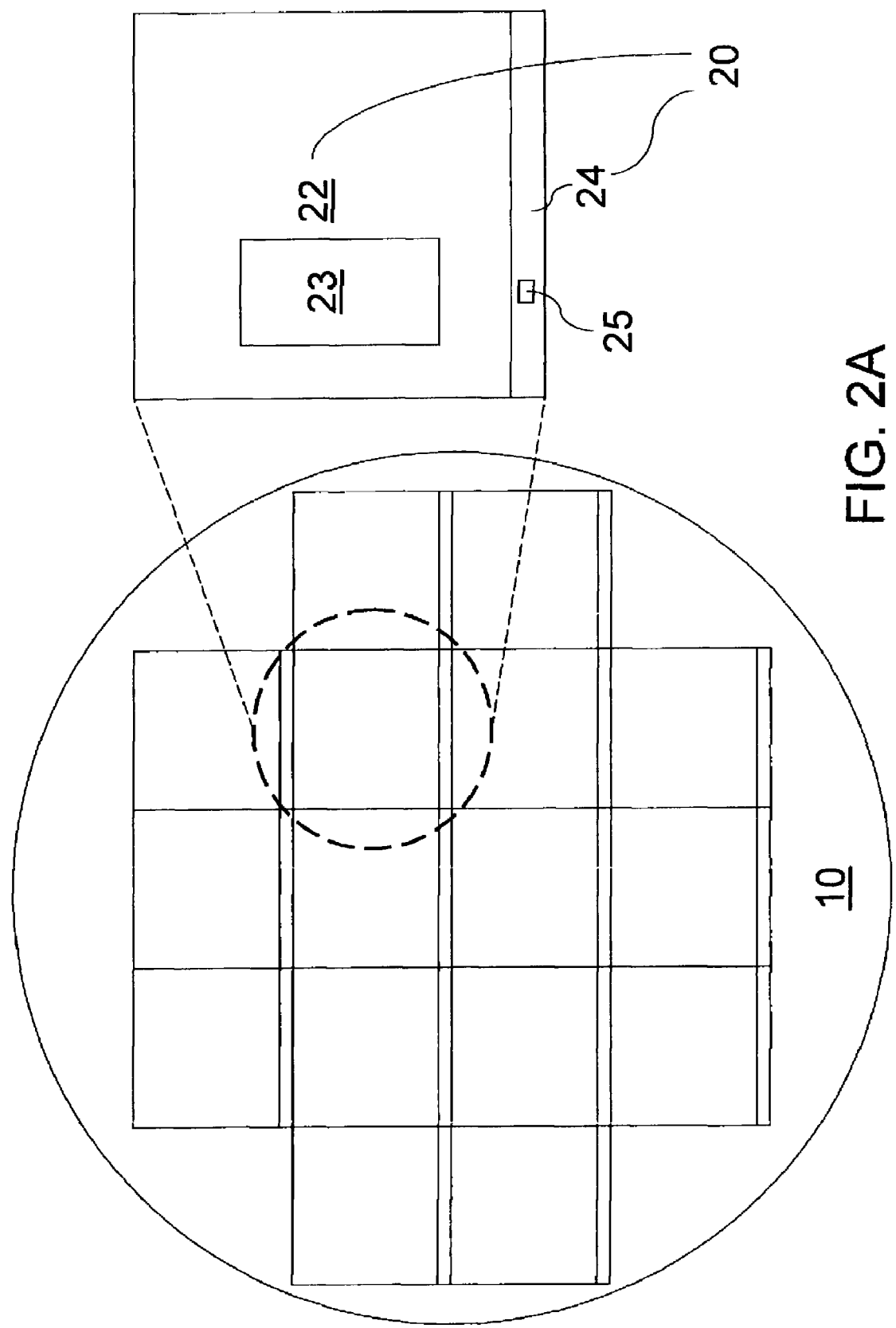
FIG. 2A is a semiconductor substrate containing a plurality of semiconductor dies, each of which contains a semiconductor chip and a exemplary test structure according to the present invention.

FIG. 2A shows an exemplary semiconductor substrate 10 containing a plurality of semiconductor dies 20 according to the present invention. Each semiconductor die 20 comprises a semiconductor chip 22 and an exemplary test structure 24 located in a scribe area, or a "KERF" area of the semiconductor die 20. The scribe area collectively refers to the area of the semiconductor die 20 that does not get incorporated into a product chip. In contrast, the area of the semiconductor die 20 that is included in a product chip is referred to as a product area, which includes the semiconductor chips 20. The scribe area may contain additional test structures other than the exemplary test structure of the present invention.

The semiconductor chip 22 includes a first array 23 of CMOS image sensors of a same type. The number of CMOS image sensors in the first array 23 may be from about 1,024 ($=2^{10}$) to about 67,108,864 ($=2^{26}$, or 64 Mbit), and typically from about 1,048,576 ($=2^{20}$, or 1 Mbit) to about 16,777,216 ($=2^{24}$, or 16 Mbit).

The exemplary test structure 24 includes a second array 25 of CMOS image sensors of the same type as the CMOS image sensors within the first array 23. Preferably, the orientation of the CMOS image sensors in the second array 25 is the same as the orientation of the CMOS sensors in the first array so that any process defects in the first array 23 is replicated with a high probability in the second array 25. The first array 23 has a greater number of the CMOS image sensors than the second array 25 so that the area occupied by the second array 25 may be confined within the limited area of the exemplary test structure. The second array 25 may be an m×n array, in which m is a number greater than or equal to 2 and less than or equal to 1024, and wherein n is a number greater than or equal to 2 and less than or equal to 1024. Typically, m is a number greater than or equal to 8 and less than or equal to 24, and n is a number greater than or equal to 8 and less than or equal to 24. The number of image sensors in the second array 25 may be from about 4 to about 1,048,576 ($=2^{20}$, or 1 Mbit), and is typically from about 64 to about 576.

Figure 2B:
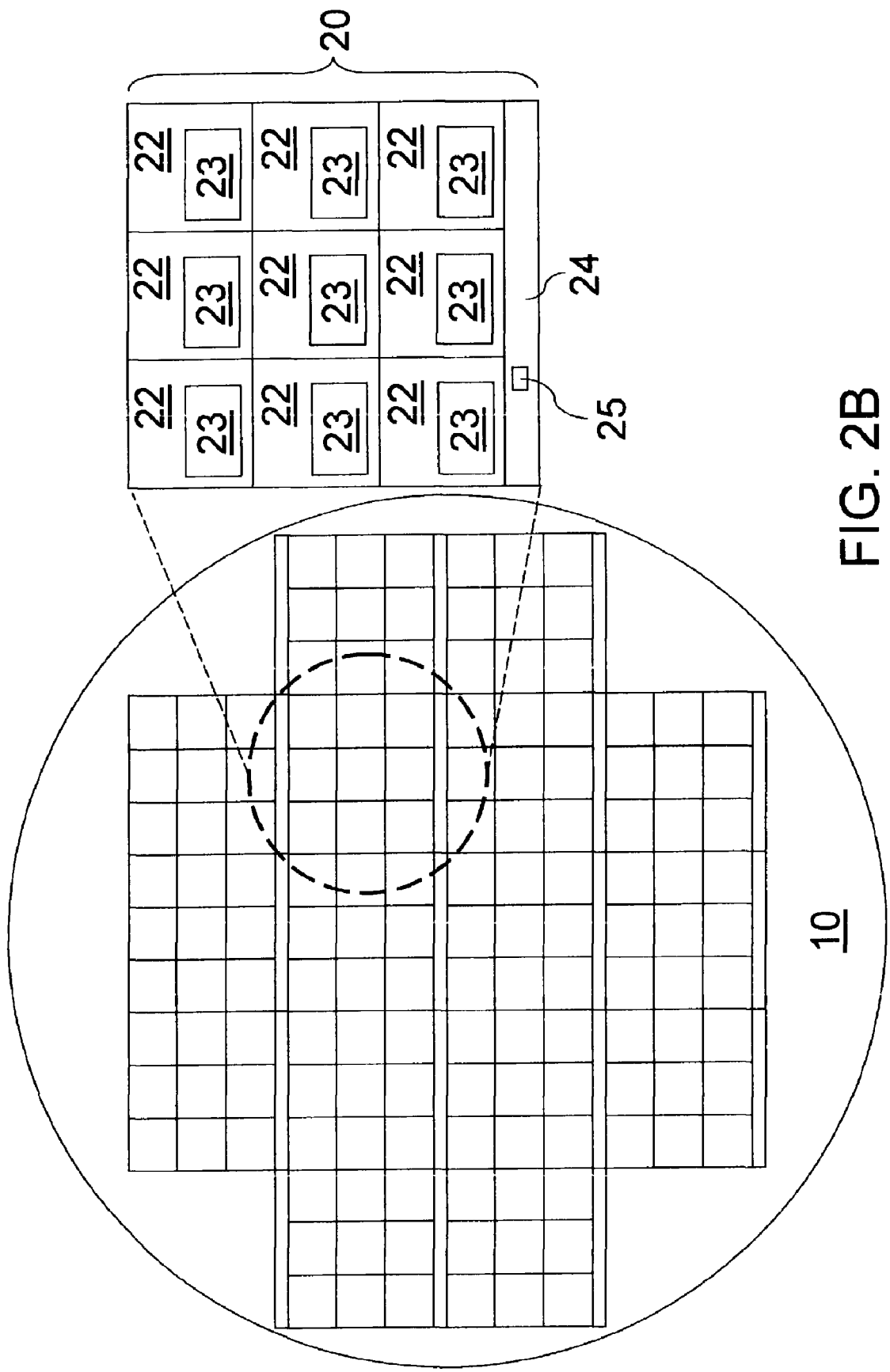
FIG. 2B is another semiconductor substrate containing a plurality of semiconductor dies, each of which contains a plurality of semiconductor chips and a exemplary test structure according to the present invention.

FIG. 2B shows another exemplary semiconductor substrate 10 containing a plurality of semiconductor dies 20 according to the present invention. Each semiconductor die 20 comprises a plurality of semiconductor chips 22 and an exemplary test structure 24 located in a scribe area, or a "KERF" area of the semiconductor die 20. The scribe area collectively refers to the area of the semiconductor die 20 that does not get incorporated into a product chip, which contains a semiconductor chip 22 or a plurality of semiconductor chips 22. In contrast, the area of the semiconductor die 20 that is included in a product chip is referred to as a product area, which includes the semiconductor chips 20. The scribe area may contain additional test structures other than the exemplary test structure of the present invention.

The semiconductor chip 22 includes a first array 23 of CMOS image sensors of a same type in the same manner as described above. The exemplary test structure 24 includes a second array 25 of CMOS image sensors of the same type as the CMOS image sensors within the first array 23 in the same manner as described above.

In general, a semiconductor die may comprise a j×k array of semiconductor chips 22 and a test structure, in which j and k are positive integers. Further, a semiconductor die may comprise multiple test structures and one semiconductor chip 22 or a plurality of semiconductor chips 22.

Figure 3:
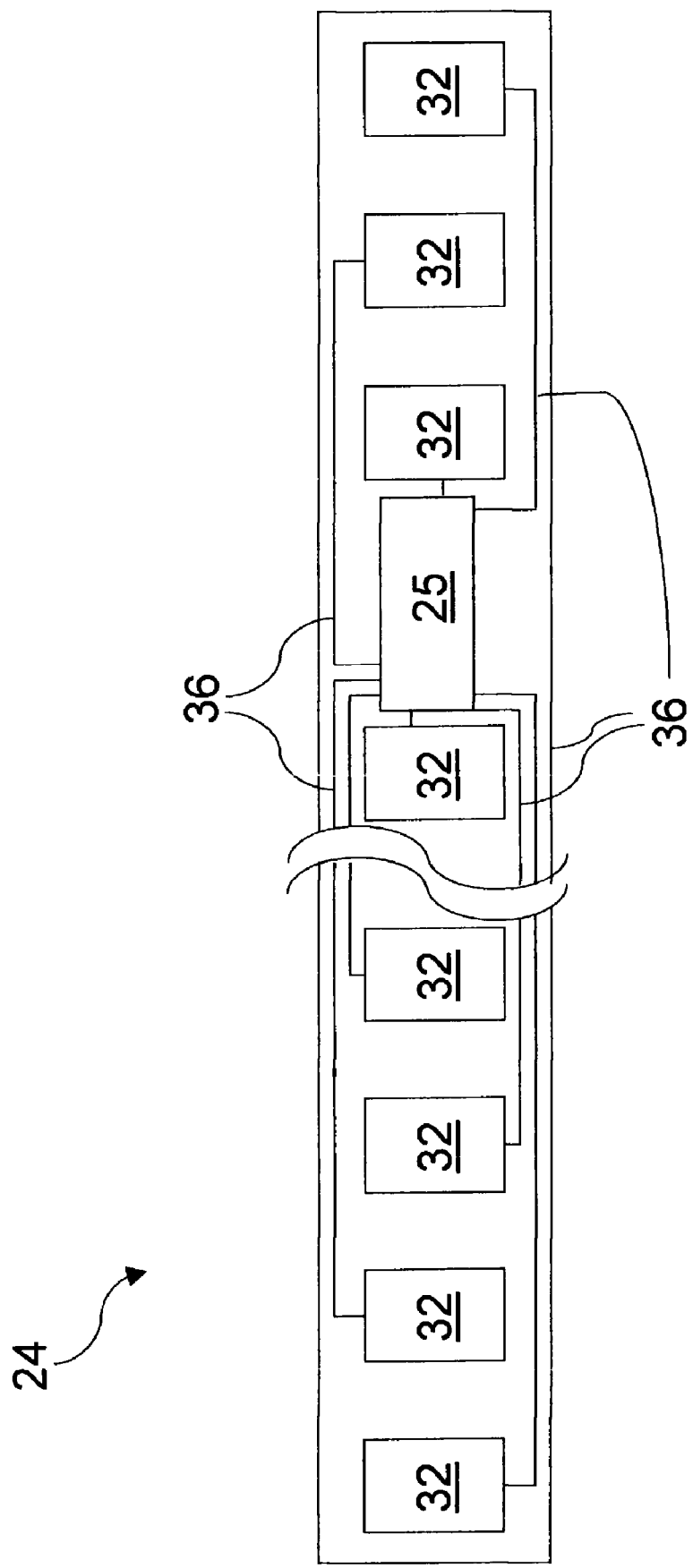
FIG. 3 is a magnified view of the exemplary test structure according to the present invention.

FIG. 3 provides a magnified view of the exemplary test structure 24. The exemplary test structure comprises pads 32, the second array 25 of CMOS image sensors, and electrical wiring 36 that connects the pads 32 and the second array 25 such that the second array 25 is testable through the pads 32. The electrical wiring 36 typically comprises metal lines, e.g., Cu lines and/or Al lines, located in thin wire levels and/or fat wire levels, but may also be provided by any conductive material formed in front-end-of-the-line (FEOL) processes.

The pads 32 include input pads, output pads, at least one power supply pad, and at least one ground pad. The pads 32 are also called "test pads" since a tester probe may contact the pads 32. The input pads provide digital and analogue input signals employed to test the functionality of the second array 25. The output pads provide a signal path for the out signal(s) from the second array 25 so that the output signal(s) may be transmitted through a tester probe, which lands on the pads 32 to make a physical contact, to a tester. The second array 25 may be located between a pair of adjacent pads 32 or may be dispersed between multiple locations around multiple pads 32.

Figure 4B:
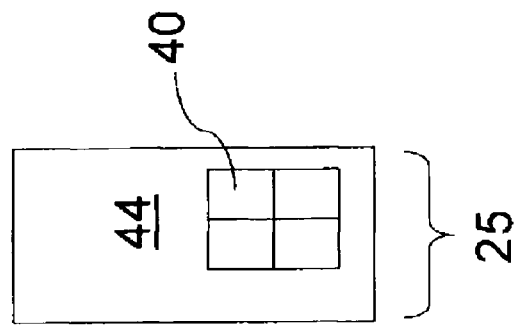
FIG. 4B is a second array of CMOS sensors from the exemplary test structure according to the present invention.
Figure 4A:
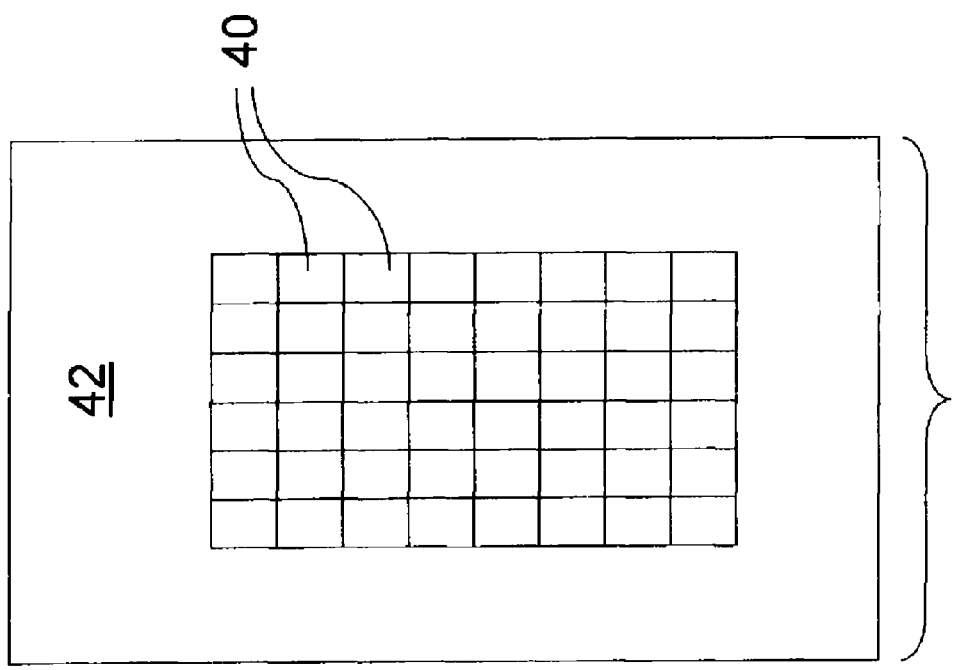
FIG. 4A is a first array of complementary metal oxide semiconductor (CMOS) image sensors from a semiconductor chip according to the present invention.

FIG. 4A shows a magnified view of the first array 23 of CMOS image sensors according to the present invention. The first array 23 comprises a plurality of instances of a CMOS image sensor 40 of a same type, i.e., all CMOS image sensors within the first array are of the same type. The first array also comprises a first array peripheral circuitry 42, which provides at least the functionality provided by the peripheral circuitry of the exemplary test structure of FIG. 1. The first array peripheral circuitry 42 may also provide additional functionalities as desired.

It is herein noted that a set of color-sensitive pixels, e.g., a set of red-sensitive pixel, green-sensitive pixel, and a blue-sensitive pixel, is herein considered to be a single image sensor since the set collectively constitutes a unit which is repeated within the first array. The same type herein refers to identical design in a data structure, which is implemented as identical physical structures in the semiconductor chip 22 (See FIG. 2). While many variations are possible in terms of the characteristics of each components of a CMOS image sensor such as the size of a photodiode, the circuitry employed within a CMOS image sensor, the optical characteristics of color filters, the first array 23 is formed by repetition of the same type of CMOS image sensor so that each CMOS sensor within the first array 23 is identical both in design and in physical structure.

FIG. 4B shows a magnified view of the second array 25 of CMOS image sensors according to the present invention. The second array 25 comprises another plurality of instances of the CMOS image sensor 40 employed in the first array 23. Thus, the second array 25 comprises the same type of CMOS image sensors as the first array 23. The second array 25 also comprises a second array peripheral circuitry 44, which provides the functionality of the peripheral circuitry of the exemplary test structure of FIG. 1.

As described above, the orientation of the CMOS image sensors in the second array 25 is preferably the same as the orientation of the CMOS sensors in the first array 23 so that any process defects in the first array 23 is replicated with a high probability in the second array 25. The first array 23 has a greater number of the CMOS image sensors than the second array 25 so that the area occupied by the second array 25 may be confined within the limited area of the exemplary test structure. The number of the CMOS image sensors in the second array 25 is selected so that sufficient statistical correlation exists between data on process defects and/or functionality gathered from the second array 25 has a meaningful statistical correlation with the process defects in the first array 23 and/or the functionality of the first array 23. Since the first array 23 and the second array 25 employ the same type of CMOS image sensors, the same design data is employed in the design phase of the first array 23 and the second array 25.

FIGS. 5A and 5B describe an exemplary process of designing the exemplary test structure 24. Referring to FIG. 5A, the exemplary test structure 24 may be designed with an empty reserved area 40E for a plurality of instances of the CMOS image sensor prior to completion of design of the exemplary test structure 24. The design for the second array peripheral circuitry 44 is included in the design at this point. After routing and placing phase of the design of a semiconductor chip 22, placement of the semiconductor chip 22 within a semiconductor die 20 is determined. The placement of the exemplary test structure 24 within the semiconductor die 20 is then determined.

Referring to FIG. 5B, the empty reserved area is thereafter filled in the design data with the plurality of instances of the CMOS image sensor 40 such that the orientation of the CMOS image sensors 40 in the second array 25 matches the orientation of the CMOS image sensors 40 in the first array 23 (See FIGS. 4A and 4B). In other words, the orientation of the CMOS image sensors of the second array 25 is adjusted to match an orientation of the CMOS image sensors 40 of the first array 23 so that statistical correlation of process defects and functionality of CMOS image sensors 40 in the second array 25 with those of CMOS image sensors 40 in the first array 23 is enhanced. Once the design data is completed, semiconductor dies 20 may be physically manufactured on semiconductor substrates 10.

Thus, the present invention provides a test structure having a "standard footprint" and providing access to in-line tester probes. During a manufacturing sequence, the test structure is tested in-line to generate test data for yield learning and/or line monitoring. The test data may also be used to determine the quality of the manufactured semiconductor wafers, e.g. to determine whether a particular semiconductor wafer meets criteria for commercial purchase commonly known as Wafer Acceptance Criteria (WAC).

Further, if the test structure is designed with an empty reserved area, or a standard "socket," such a design for the test structure allows placement of instances of CMOS image sensor that is employed in a semiconductor chip. For example, the selection of the CMOS image sensor may be done by a customer, or a purchaser of semiconductor wafers, during the design of the semiconductor chip. Once the customer determines the type of the CMOS image sensor in the semiconductor chip, the type and rotation of the CMOS image sensors in the test structure may be performed to match the type and orientation of the CMOS image sensors in the semiconductor chip. The matching of the type of the CMOS image sensors is advantageous since different pixels require different process parameters. The matching of the rotation of the CMOS image sensors across a first array in the semiconductor chip and a second array in the test structure improves the correlation of test data from the test structure to the functionality of the semiconductor chip.

Figure 6:
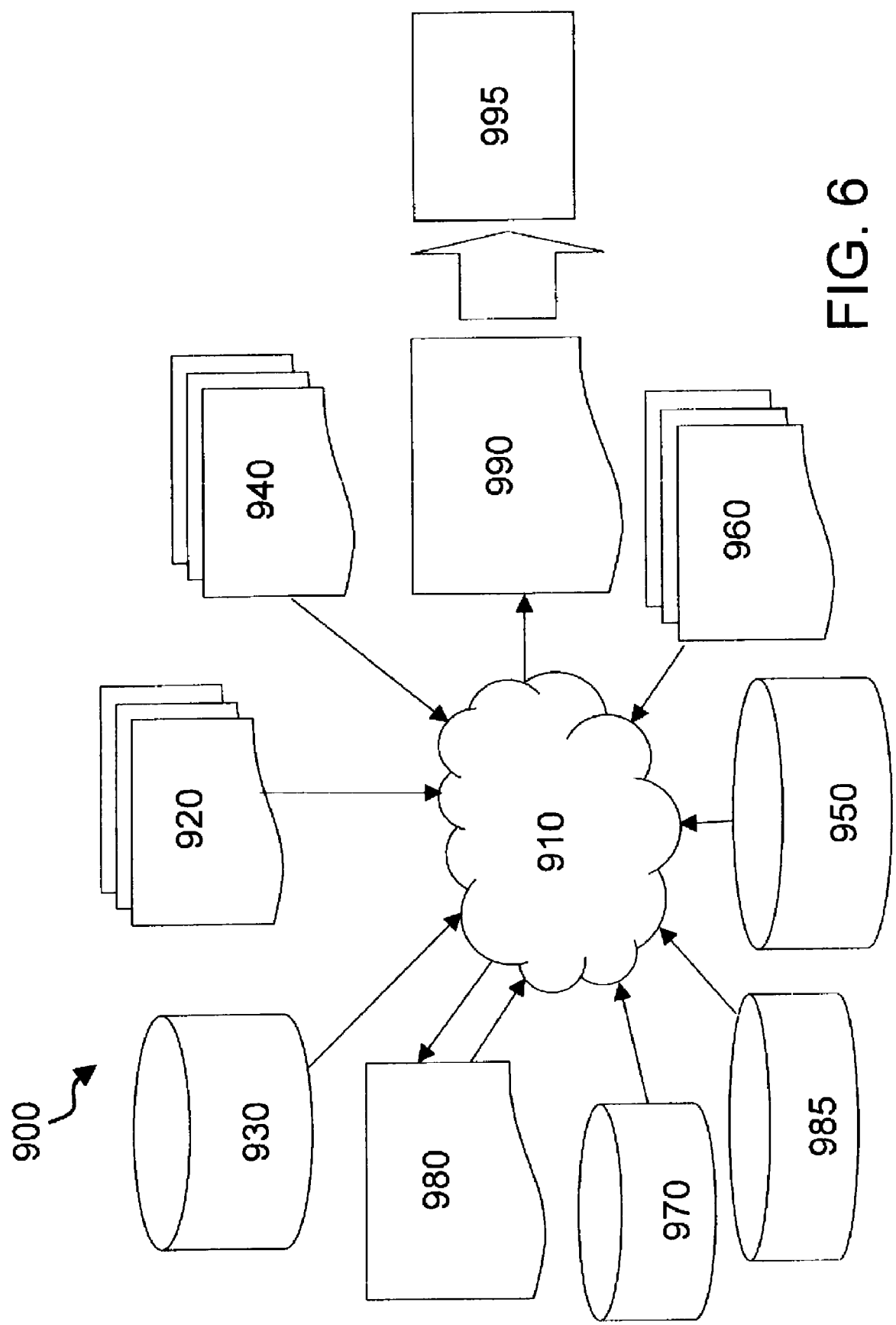
FIG. 6 is a flow diagram of a design process used in semiconductor design and manufacture of the semiconductor circuits according to the present invention.

FIG. 6 shows a block diagram of an exemplary design flow 900 used for example, in semiconductor design and manufacturing of the semiconductor circuit according to the present invention. Design flow 900 may vary depending on the type of integrated circuit (IC) being designed. For example, a design flow for building an application specific integrated circuit (ASIC) may differ from a design flow for designing a standard integrated circuit component. Design structure 920 is preferably an input to a design process 910 and may come from an intellectual property (IP) provider, a core developer, or a design company, or may be generated by the operator of a design flow, or may come from other sources.

Design structure 920 comprises an embodiment of present invention as shown above in the form of schematics or hardware description language (HDL; e.g. Verilog, VHDL, C, etc.) The design structure 920 may be contained on one or more machine readable medium. For example, design structure 920 may be a text file or a graphical representation of the semiconductor structure of the present invention to be manufactured as a semiconductor die.

For example, the design structure may comprise:

a first data representing a semiconductor chip 20, wherein said first data includes a second data representing a first array 23 of complementary metal oxide semiconductor (CMOS) image sensors 40 of a same type; and a third data representing a test structure 24, wherein said third data includes a fourth data representing a set of pads 32, a fifth data representing a second array 25 of complementary metal oxide semiconductor (CMOS) image sensors 40 of said same type, and a sixth data representing electrical wiring 36 connecting said set of pads 32 and said second array 25 such that said second array 25 is testable through said set of pads 32.

The design structure may further comprise additional data such as a seventh data representing a peripheral circuitry providing an interface between the electrical wiring 36 and the second array. Particularly, the seventh data may comprise at least one of an eighth data representing a row decoder, a ninth data representing a column decoder, a tenth data representing a row driver, an eleventh data representing column receivers, a twelfth data representing a column multiplexer, and a thirteenth data representing an operational amplifier (OP-amp).

Design process 910 preferably synthesizes (or translates) an embodiment of the invention to be manufactured as a semiconductor die into a netlist 980, where the netlist 980 is, for example, CMOS image sensor arrays, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which the netlist 980 is resynthesized one or more times depending on design specifications and parameters for the circuit.

The design process 910 may include using a variety of inputs; for example, inputs from library elements 930 which may house a set of commonly used elements, circuits, and devices, including models, layouts, and symbolic representations, for a given manufacturing technology (e.g., different technology nodes such as 32 nm, 45 nm, and 90 nm, etc.), design specifications 940, characterization data 950, verification data 960, design rules 970, and test data files 985 (which may include, for example, standard circuit design processes such as timing analysis, verification, design rule checking, place and route operations, etc. One of ordinary skill in the art of integrated circuit design can appreciate the extent of possible electronic design automation tools and applications used in the design process 910 without deviating from the scope and spirit of the present invention. The design structure of the present invention is not limited to any specific design flow.

Design process 910 preferably translates an embodiment of the invention as shown in FIG. 2A or FIG. 2B, along with any additional integrated circuit deign or data (if applicable), into a second design structure 990. Design structure 990 resides on a storage medium in a data format used for the exchange of layout data of integrated circuits and/or symbolic data format (e.g., information stored in GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing though the manufacturing line, and any other data required by a semiconductor manufacturer to produce one of the embodiments of the semiconductor structures of the present invention. Design structure 990 may then proceed to a stage 995 where, for example, design structure 990 proceeds to tape-out, is released to manufacturing, is released to a mask house, is sent to another design house, is sent back to a customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of monitoring process defects of a complementary metal oxide semiconductor (CMOS) image sensor array, said method comprising:

manufacturing a semiconductor die containing at least one semiconductor chip and at least one test structure, wherein each of said at least one semiconductor chip includes a first array of complementary metal oxide semiconductor (CMOS) image sensors of a type, and wherein each of said at least one test structure includes a second array of complementary metal oxide semiconductor (CMOS) image sensors of said type, and said second array is an m×n array including m×n number of CMOS image sensors of said type, wherein said CMOS image sensors of said type in said first array and said CMOS image sensors of said type in said second array have a same first periodicity along a direction of m repetitions of said m×n array and a same second periodicity along a direction of n repetitions of said m×n array; and testing said at least one test structure to provide feedback on semiconductor manufacturing processes employed to manufacture said at least one semiconductor chip.

2. The method of claim 1, further comprising designing said at least one test structure such that said CMOS image sensors in said first array and said CMOS image sensors in said second array have the same orientation.

3. The method of claim 1, further comprising:

designing said at least one test structure with an empty reserved area for said second array prior to completion of design of said at least one test structure; and filling said empty reserved area in a design data with said CMOS image sensors prior to manufacture of said semiconductor die.

4. The method of claim 3, further comprising adjusting orientation of said CMOS image sensors of said second array to match an orientation of said CMOS image sensors of said first array.

5. The method of claim 1, wherein said first array has a greater number of said CMOS image sensors than said second array.

6. The method of claim 5, wherein m is a number greater than or equal to 2 and less than or equal to 1024, and wherein n is a number greater than or equal to 2 and less than or equal to 1024.

7. The method of claim 6, wherein m is a number greater than or equal to 8 and less than or equal to 24, and wherein n is a number greater than or equal to 8 and less than or equal to 24.

8. The method of claim 1, wherein each of said at least one test structure further comprises:

a set of pads; and electrical wiring connecting said set of pads and said second array such that said second array is testable through said set of pads.

9. The method of claim 8, wherein each of said at least one test structure further comprises a peripheral circuitry configured to be connected with a plurality of types of CMOS image sensors.

10. The method of claim 9, wherein said peripheral circuitry comprises a row decoder, a column decoder, a row driver, column receivers, a column multiplexer, and an operational amplifier (OP-amp).

\* \* \* \* \*